United States Patent [19]
Ogoh

[11] Patent Number: 5,097,137
[45] Date of Patent: Mar. 17, 1992

[54] METHOD OF MANUFACTURING SEMI-CONDUCTOR DEVICE COMPRISING STEP OF PATTENING RESIST AND LIGHT IRRADIATION APPARATUS USED BY THE MANUFACTURING METHOD.

[75] Inventor: Ikuo Ogoh, Hyogo, Japan

[73] Assignee: Mitsubishi Denki Kabushiki Kaisha, Tokyo, Japan

[21] Appl. No.: 596,437

[22] Filed: Oct. 12, 1990

Related U.S. Application Data

[62] Division of Ser. No. 321,810, Mar. 10, 1989, Pat. No. 5,001,039.

[30] Foreign Application Priority Data

Mar. 14, 1988 [JP] Japan .................. 63-61426
Feb. 23, 1989 [JP] Japan .................. 1-44318

[51] Int. Cl.$^5$ .................................. G21K 5/00
[52] U.S. Cl. ...................... 250/492.2; 250/492.1
[58] Field of Search ................ 250/492.2, 492.1

[56] References Cited

U.S. PATENT DOCUMENTS 4,023,904 5/1977 Sheets ..................... 250/492.2
4,814,244 3/1989 Koguchi et al. ............. 430/30
4,826,756 5/1989 Orvek ..................... 430/328

FOREIGN PATENT DOCUMENTS 60-725    4/1985  Japan .
62-131517 12/1985 Japan .
62-183521 2/1986  Japan .
62-295420 6/1986  Japan .
183521    8/1987  Japan .

OTHER PUBLICATIONS

R. Allen, "Deep U.V. Hardening of Positive Photoresist Patterns", Journal of the Electrochemical Society (Jun. 1982), pp. 1379-1381.

Primary Examiner—Jack I. Berman
Attorney, Agent, or Firm—Lowe, Price, LeBlanc & Becker

[57] ABSTRACT

A method of forming a resist pattern on a main surface of a semiconductor substrate comprising the steps of exposing a resist to light and developing it to become a predetermined pattern, curing the surface of the resist pattern formed by the exposing and developing treatments by irradiating the surface with far ultraviolet rays having a short wavelength, and baking the resist pattern subjected to a light irradiation treatment. The light irradiation treatment is performed by irradiating the surface of the resist pattern, which is not shaded from light with the far ultraviolet rays, in a state in which a resist pattern region formed on a peripheral portion of the semiconductor substrate is shaded from light. As a result, a crack can be prevented from forming on the resist of the peripheral portion of the semiconductor substrate. A light irradiation apparatus used in the light irradiation treatment comprises shading means for selectively intercepting the irradiation light. The shading means prevent light irradiation onto the resist pattern of the peripheral portion of the semiconductor substrate.

3 Claims, 4 Drawing Sheets

METHOD OF MANUFACTURING SEMICONDUCTOR DEVICE COMPRISING STEP OF PATTENING RESIST AND LIGHT IRRADIATION APPARATUS USED BY THE MANUFACTURING METHOD.

This application is a division of application Ser. No. 07/321,810 filed Mar. 10, 1989, now U.S. Pat. No. 5,001,039.

BACKGROUND OF THE INVENTION

1. Field of the Invention

The present invention generally relates to an improvement of a step of patterning a resist for forming a desired minute pattern on a semiconductor substrate in a method of manufacturing a semiconductor device. More particularly, it relates to an improvement of a structure of a light irradiation apparatus used in the resist patterning step.

2. Description of the Background Art

Recently, a semiconductor device has been developed remarkably and the degree of integration and miniaturization of a circuit pattern constituting the semiconductor device has been increased. In order to implement a higher degree of integration and miniaturization of the semiconductor device, various developments and improvements in the manufacturing process and manufacturing apparatus are made.

When the structure of the semiconductor device is to be miniaturized, a resist patterning technique using photolithography is one of the important techniques. This is a technique which patterns a semiconductor layer or a metal layer deposited on the semiconductor substrate into a predetermined miniaturized configuration. Referring to FIGS. 3A to 3D, a description is given of this resist patterning technique. In addition, this resist patterning technique is described in, for example, the Japanese Patent Laying-Open Gazette No. 295420/1987.

First, a resist 3 of a photosensitive material is applied to the surface of a patterned layer 2 formed on a semiconductor substrate 1. Then, the resist 3 is selectively exposed to light such as X-rays or UV-rays using a mask pattern 4. The mask pattern 4 has a predetermined pattern (FIG. 3A).

Then, the exposed resist 3 is developed to remove a resist other than a resist pattern 3a having a predetermined configuration (FIG. 3B).

Next, the surface of the resist pattern 3a is irradiated with light to cure the surface of the resist pattern 3a (FIG. 3C).

Thereafter, the resist pattern 3a is baked at a high temperature in a baking treatment (FIG. 3D).

As described above, the resist pattern is formed.

A description was given of a case where the above described steps used a positive resist in which an exposed portion was removed.

A description is given of a curing treatment of the surface of the resist pattern 3a by light irradiation shown in FIG. 3C.

FIG. 4 is a schematic structure of a conventional light irradiation apparatus. In addition, FIG. 4 is a schematic diagram showing the state in which the resist pattern 3a is irradiated with light using this device. Referring to FIG. 4, a semiconductor substrate (wafer) 1 on which the resist pattern 3a was formed in a developing treatment is put on a stage 5. A light source 6 for light irradiation is arranged above the stage 5. In addition, a concave reflection mirror 7 is provided above the light source 6. The reflection mirror 7 reflects the light irradiated from the light source 6 to produce collimated light. There is provided a shutter 9 for shading or transmitting irradiation light 8 between the light source 6 and the stage 5.

Light irradiation processing using the above-mentioned light irradiation apparatus is carried out as follows. The wafer 1 on which the resist pattern 3a was formed is carried onto the stage 5 in the light irradiation apparatus by carrying means (not shown) and fixed on the surface of the stage 5. Then, the shutter 9 is opened by driving means (not shown). Thereafter, far ultraviolet rays (irradiation light) 8 is irradiated from the light source 6. The far ultraviolet rays 8 reflects on the surface of the reflection mirror 7 and becomes collimator light. Then, the whole surface of the wafer 1 on which the resist pattern 3a was formed is irradiated with the collimator light of the far ultraviolet rays 7.

The far ultraviolet rays 8 have usually a short wavelength of 200~300 nm. Irradiation time is usually approximately 1~2 minutes. The surface of the resist pattern 3a irradiated with the far ultraviolet rays 8 of a short wavelength is cured by a photopolymerization reaction. Then, the resist pattern 3a having a cured surface prevents a pattern precision from deteriorating during the baking treatment shown in FIG. 3D.

A description is given of a difference of pattern configurations after the baking treatment with or without the light irradiation treatment, using FIGS. 5 and 6. FIG. 5 is a sectional view of a wafer in a case where the light irradiation treatment was not performed. FIG. 6 is a sectional view of a wafer in a case where the light irradiation treatment was performed. Referring to FIGS. 5 and 6, the configuration of the resist pattern before the baking treatment is shown by a dotted line 10. The configuration of the resist pattern after the baking treatment is shown by a solid line 11.

As shown in FIG. 5, a resist droop of the resist pattern is formed due to a high temperature during baking in the resist pattern not treated with the light irradiation. For this reason, the resist pattern originally formed with a line width W1 is enlarged to be a line width of W2, so that the sectional configuration of the resist pattern is changed. As a result, the resist pattern is prevented from being miniaturized.

On the other hand, as shown in FIG. 6, in the resist pattern treated with the light irradiation, pattern width W3 changed by the baking treatment is smaller than the pattern width W2 shown in FIG. 5, because a cured surface layer is formed on the surface of the resist pattern by the light irradiation treatment, which enhances heat resistance during the baking treatment.

As described above, a method of manufacturing a conventional semiconductor device comprises the step of irradiating the whole surface of the resist pattern 3a formed on the wafer 1 with light to cure the surface.

However, when the light irradiation treatment was performed, it was found that a number of cracks were formed at the resist applied to the peripheral edge portion of the wafer. This crack deteriorates the adhesion between the resist and the wafer surface. In addition, it causes damage or peeling of the resist pattern. More specifically, since the wafer 1 having the resist pattern 3a often touches a guide portion or supporting portion of the device when it is carried or handled during the manufacturing step, or housed or fetched to or from a cassette, the resist pattern 3a on the wafer 1 is strongly shocked at this time. Since the resist pattern 3a is brittle, the resist is cracked by the shock and the resist pattern is peeled or damaged. The peeled resist pattern is scattered on the wafer 1 as foreign substances and adheres to a normal resist pattern portion, causing a pattern defect. In addition, the scattered resist adheres to the guide portion or the supporting portion of the device and contaminates the device. It also adheres to another wafer surface during another wafer treatment, causing a pattern defect of the wafer. Such a pattern defect reducing a manufacturing yield of the semiconductor device.

SUMMARY OF THE INVENTION

An object of the present invention is to provide a method of manufacturing a semiconductor device capable of improving a manufacturing yield by preventing damage of a resist pattern formed on a peripheral portion of a semiconductor substrate.

Another object of the present invention is to provide a method of manufacturing a semiconductor device capable of irradiating the surface of the resist pattern with light except for the peripheral portion of a resist pattern formed on a semiconductor substrate.

A further object of the present invention is to add means for adjusting a light irradiation region of a light irradiation apparatus used in a resist patterning step.

In a method of manufacturing a semiconductor device in accordance with the present invention, the step of forming a resist pattern comprises the steps of forming a resist pattern on the main surface of a semiconductor substrate and curing the surface of the resist pattern by irradiating the resist pattern with light having a predetermined wavelength, the step of irradiating the resist pattern surface with light being performed in such a manner that a required range of the peripheral portion of the resist pattern formed on the main surface of the semiconductor substrate is shaded from light.

In the resist pattern formed through the above described light irradiation processing, only the peripheral portion of the main surface of the semiconductor substrate is not subjected to the curing treatment. Therefore, the crack formed on the peripheral portion of the wafer during a conventional light irradiation treatment can be prevented from occurring at the peripheral portion of this resist pattern. As a result, peeling or damage of the resist pattern due to the crack can be prevented. In addition, the resist pattern defect due to the resist scattered from the wafer surface can be prevented because of the prevention of the crack. Consequently, the manufacturing yield of the semiconductor device can be improved.

In addition, the treatment of curing the surface of the resist pattern in the above-described resist patterning method is performed using a light irradiation apparatus. The light irradiation apparatus comprises supporting means for supporting a semiconductor substrate; light irradiating means for irradiating the main surface of the semiconductor substrate supported by the supporting means with light of a predetermined wavelength to cure the surface of the resist pattern; and shading mean provided between the supporting means and the light irradiating means for preventing the light irradiated from the light irradiating means from irradiating a peripheral portion of the main surface of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description is given of a preferred embodiment of the present invention using figures. Resist patterning steps in accordance with this embodiment are the same as those described in FIGS. 3A to 3D. Therefore, the above description and FIGS. 3A to 3D are used when a description is given of the resist patterning steps of this embodiment. A description is given of the light irradiation step shown in FIG. 3 which is the characteristic of the present invention in the following.

Figure 1:
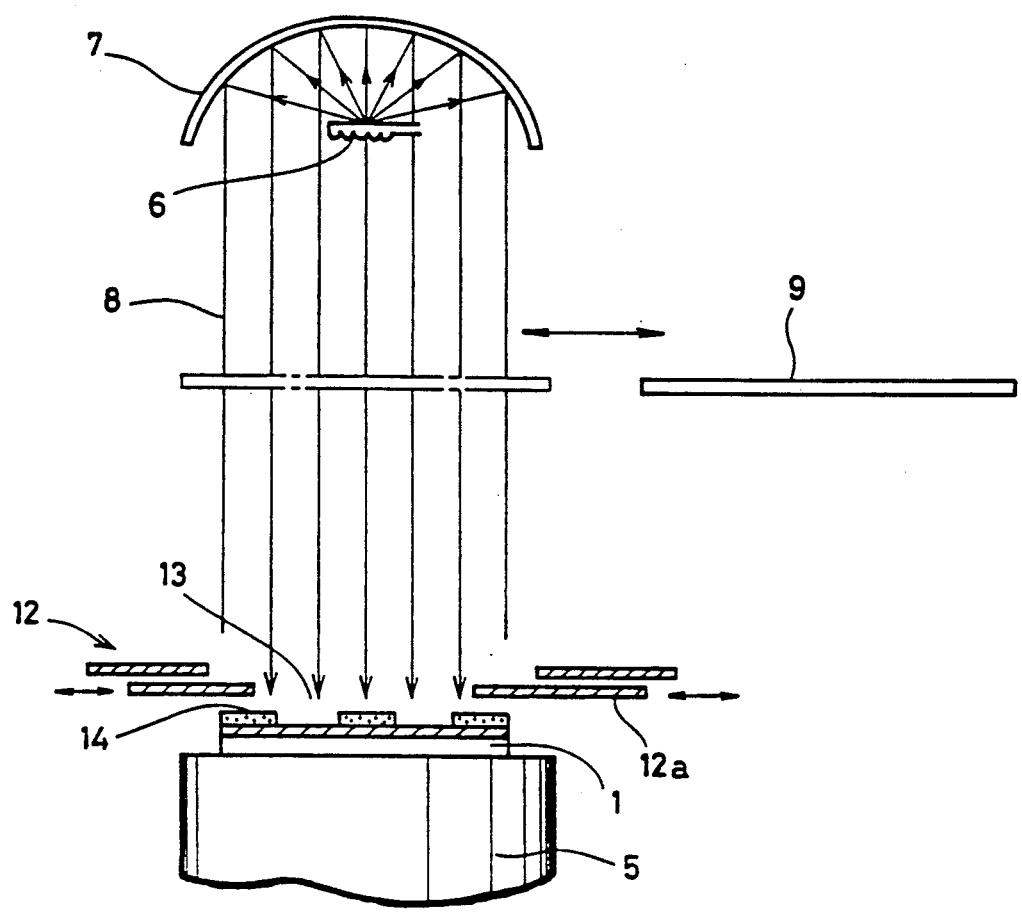
FIG. 1 is a schematic sectional view of a light irradiation apparatus showing a method of irradiating the resist pattern with light in accordance with one embodiment of the present invention.

Referring to FIG. 1, the light irradiation apparatus comprises a stage 5 on which a wafer is put; a light source 6 provided above the stage 5; a concave reflection mirror 7 provided above the light source 6 and reflecting irradiation light; and a shutter 9 positioned between the light source 6 and the stage 5 and performing opening/closing operation for shading/transmitting the irradiation light. In addition, a diaphragm 12 is provided between the shutter 9 and the stage 5 with the center portion opened. The diaphragm 12 comprises adjusting means for adjusting this opening area. For example, the diaphragm 12 comprises a movable plate 12a.

Figure 2:
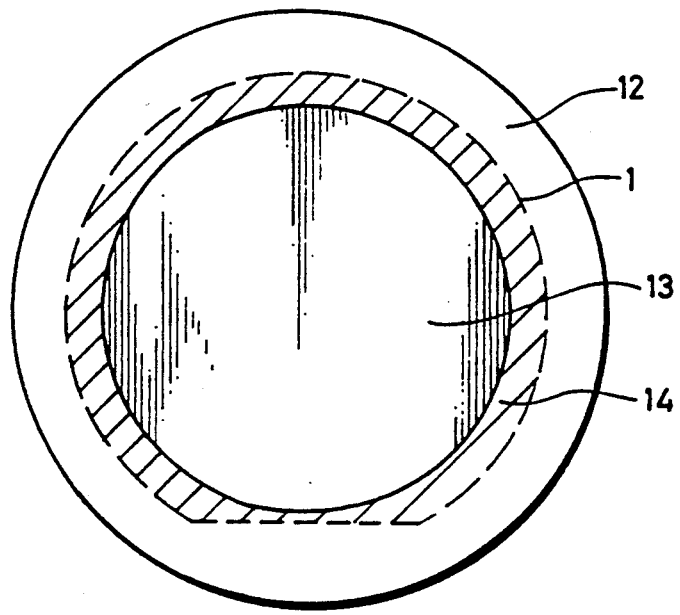
FIG. 2 is a schematic plan view of a wafer showing how the wafer is shaded from light in a light irradiation step in accordance with the present invention.
Figure 4:
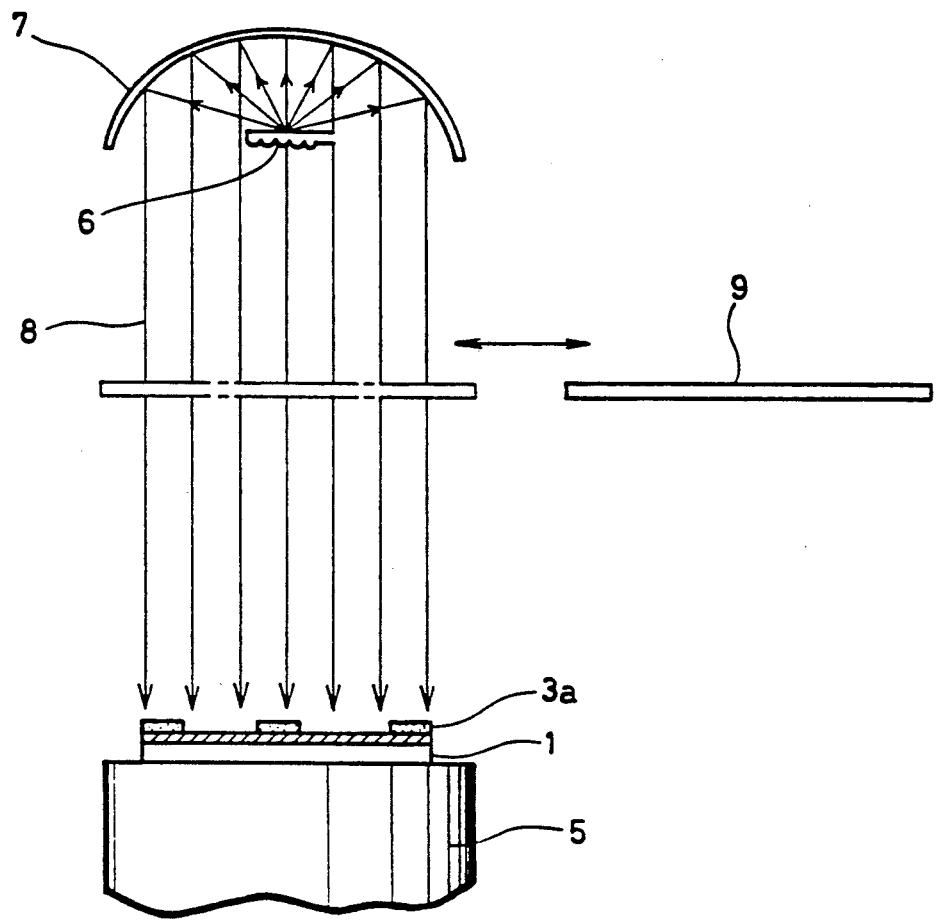
FIG. 4 is a schematic sectional view of a light irradiation apparatus showing a method of irradiating a conventional resist pattern with light.
Figure 5:
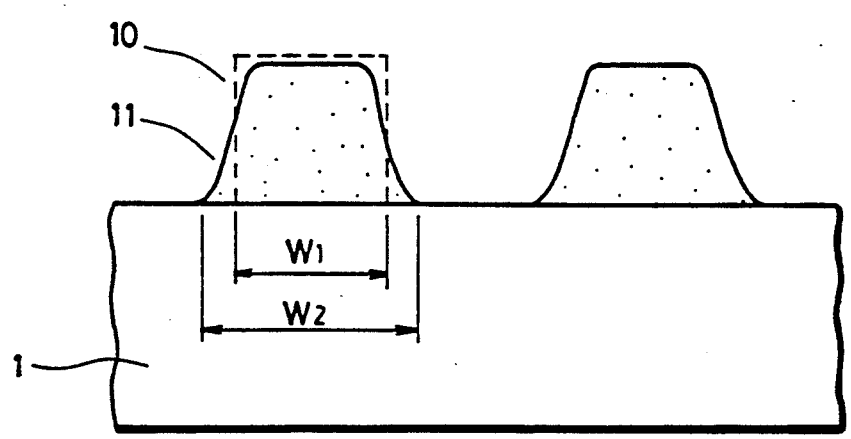
FIG. 5 is a schematic sectional view of a resist pattern subjected to a baking treatment without a light irradiation treatment.
Figure 6:
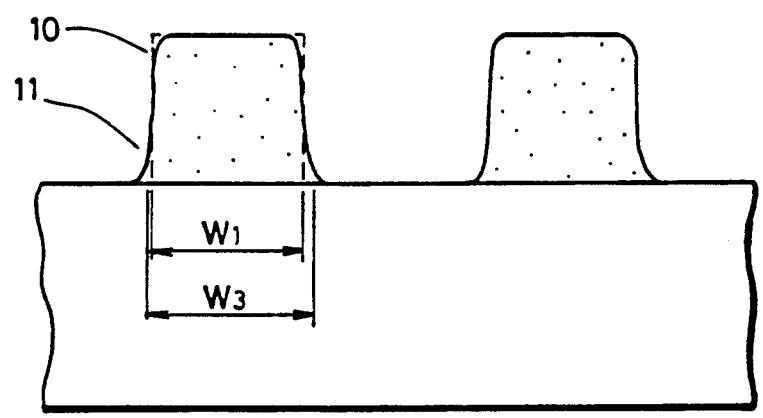
FIG. 6 is a schematic sectional view of a resist pattern subjected to the baking treatment after the light irradiation treatment.

The light irradiation apparatus shown in FIG. 1 has the following characteristics as compared with the conventional light irradiation apparatus shown in FIG. 4. That is, the diaphragm 12 positioned above the wafer 1 fixed on the stage 5 can adjust its opening portion such that the opening portion may become a predetermined dimension corresponding to the diameter of the wafer 1. For example, FIG. 2 shows a positional relation between the diaphragm 12 and the wafer 1. As shown in FIG. 2, the diaphragm 12 continuously covers the peripheral portion of the wafer 1. When the shutter 9 is opened in this state, the irradiation light 8 irradiates the surface of the wafer 1. Then, a region of a resist pattern 3a on the wafer surface corresponding to the opening portion of the diaphragm 12 becomes a light irradiation region 13. The portion shaded by the diaphragm 12 becomes a shaded region 14. Far ultraviolet rays having a short wavelength of 200~300 nm is usually used as the irradiation light 8. By means of such light irradiation steps, the surface of the irradiated portion 13 in the resist pattern 3a is cured by a photopolymerization reaction by the irradiation light. However, the photopolymerization reaction is not produced in the shaded portion 14 in the resist pattern 3a. Therefore, a crack is prevented from forming in the resist pattern 3a formed at the peripheral portion of the wafer 1. As a result, even if the wafer 1 is shocked by coming in contact with the processing devices when the wafer is inserted into or outputted from the processing device or the wafer is carried or housed into or taken out from a cassette during later processes, it is possible to prevent the resist pattern formed on the peripheral portion of the wafer 1 being damaged or peeled off.

Figure 3A:
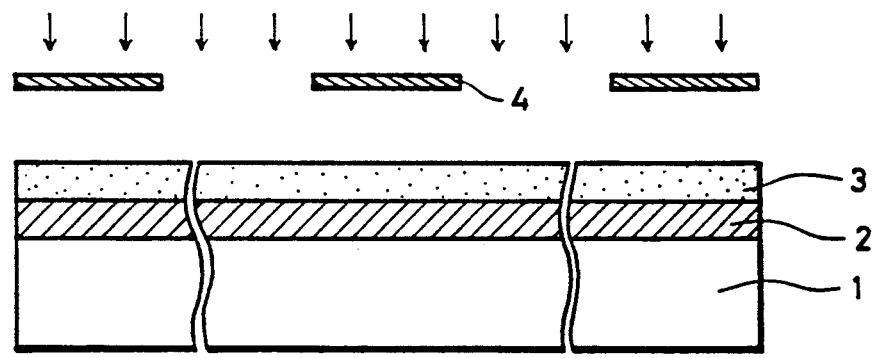
FIGS. 3A to 3D are sectional views of a semiconductor device showing general resist patterning steps.
Figure 3B:
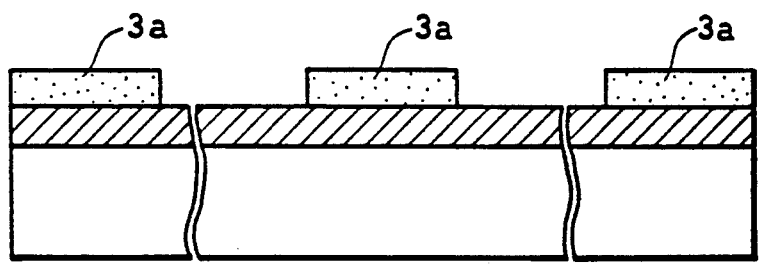
Figure 3C:
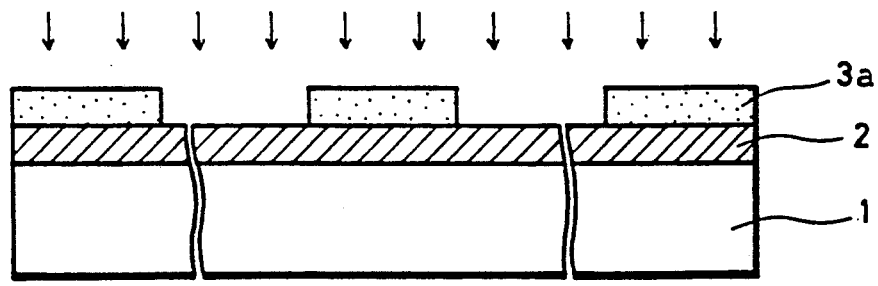
Figure 3D:
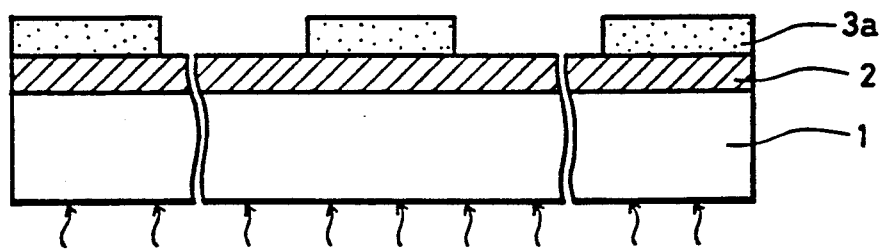

In addition, this embodiment further comprises a baking treatment after the light irradiation treatment. FIG. 3D shows the baking treatment. The baking treatment is performed with the wafer 1 put on the hot plate. The wafer 1 is heated at a high temperature by heating the hot plate at 70°~200° C. Then, the resist pattern on the wafer 1 is cured. The baking treatment enhances the adhesion between the resist pattern and the surface of the wafer 1. In addition, heat resistance or etching resistance of the resist pattern is strengthened by the combination of the baking treatment and the above-described light irradiation treatment. As a result, the precision of the resist pattern is improved.

The baking treatment and the light irradiation treatment may be performed at the same time. For example, the surface of the wafer may be irradiated with the far ultraviolet rays, while the wafer is heated on the hot plate. A heating method may be a lamp heating method.

In addition, the diaphragm 12 used in the light irradiation steps may be arranged between the shutter 9 and the light source 6. Although far ultraviolet rays were used as light irradiated to the resist patter in the above description, ultraviolet rays having a longer wavelength may be used if they can be patterned into a predetermined configuration corresponding to the characteristics of the resist.

As described above, according to the present invention, the resist pattern 3a is irradiated with light with the peripheral portion of the wafer 1 shaded using the diaphragm 12. As a result, it is possible to prevent the formation of the crack caused by curing the resist pattern in a predetermined region of the surface of the surface of the wafer 1 and also prevent the formation of foreign substances due to the peeling of the resist pattern. Consequently, there can be provided a method of manufacturing a semiconductor device having a good manufacturing yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light irradiation apparatus for curing the surface of a resist pattern by irradiating the resist pattern formed on a semiconductor substrate with light comprising;

supporting means for supporting said semiconductor substrate;

light irradiating means for irradiating the main surface of said semiconductor substrate supported by said supporting means with light having a predetermined wavelength for curing the surface of said resist pattern; and shading means for preventing light from irradiating the peripheral portion of said resist pattern formed on the main surface of said semiconductor substrate, said light being irradiated from said light irradiating means provided between said supporting means and said light irradiating means.

2. A light irradiation apparatus in accordance with claim 1, wherein said shading means comprises a shading member comprising:

a shaded region made of a material preventing the light from said light irradiating means from being transmitted and formed so as to cover the peripheral portion of the main surface of said semiconductor substrate; and an opening region surrounded by said shaded region and transmitting said irradiation light.

3. A light irradiation apparatus in accordance with claim 2, wherein said shading means comprises adjusting means for changing the opening area of said opening region.

* * * * *